(12) United States Patent
Gim

(10) Patent No.: US 11,221,915 B2
(45) Date of Patent: *Jan. 11, 2022

(54) MEMORY CONTROLLER AND METHOD OF OPERATING THE SAME

(71) Applicant: SK hynix Inc., Gyeonggi-do (KR)

(72) Inventor: Yeong Dong Gim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/012,805

(22) Filed: Sep. 4, 2020

(65) Prior Publication Data

US 2020/0401482 A1 Dec. 24, 2020

Related U.S. Application Data

(63) Continuation of application No. 16/120,834, filed on Sep. 4, 2018, now Pat. No. 10,795,762.

(30) Foreign Application Priority Data

Jan. 31, 2018 (KR) .......................... 10-2018-0012260

(51) Int. Cl.
| | |
|---|---|
| *G06F 11/10* | (2006.01) |
| *G11C 16/26* | (2006.01) |
| *G11C 29/52* | (2006.01) |
| *G11C 11/56* | (2006.01) |
| *G11C 16/34* | (2006.01) |
| *G11C 29/02* | (2006.01) |

(52) U.S. Cl.
CPC ...... *G06F 11/1068* (2013.01); *G06F 11/1048* (2013.01); *G11C 11/5642* (2013.01); *G11C 11/5671* (2013.01); *G11C 16/26* (2013.01); *G11C 16/3427* (2013.01); *G11C 29/021* (2013.01); *G11C 29/028* (2013.01); *G11C 29/52* (2013.01)

(58) Field of Classification Search
CPC .................................................. G06F 11/1068
USPC ......................... 714/764, 763, 765, 768, 770
See application file for complete search history.

(56) References Cited

U.S. PATENT DOCUMENTS

| | | | |
|---|---|---|---|
| 2016/0117216 A1* | 4/2016 | Muchherla ............. | G11C 16/10 714/6.11 |
| 2020/0098433 A1* | 3/2020 | Jeon .................... | G11C 16/0483 |
| 2020/0365213 A1* | 11/2020 | Jeon ........................ | G11C 16/26 |
| 2021/0090641 A1* | 3/2021 | Strand ................ | G11C 16/3431 |

(Continued)

*Primary Examiner* — Fritz Alphonse
(74) *Attorney, Agent, or Firm* — IP & T Group LLP

(57) ABSTRACT

Provided herein may be a memory controller and an operating method thereof. The memory controller may include: a read fail control circuit configured to perform, when the read operation fails, an assist read operation of determining optimal read voltages to be used to read the selected memory cells, and determine whether a threshold voltage distribution of the selected memory cells is an abnormal distribution based on read-related information obtained by the read operation and the assist read operation; and an error correction code (ECC) engine configured to perform an ECC decoding operation on hard decision data obtained by reading the selected memory cells using the optimal read voltages based on whether the threshold voltage distribution of the selected memory cells is the abnormal distribution.

16 Claims, 14 Drawing Sheets

(56) References Cited

U.S. PATENT DOCUMENTS

| | | | |
|---|---|---|---|
| 2021/0090680 A1* | 3/2021 | Lakshman | ............ G11C 11/221 |
| 2021/0200435 A1* | 7/2021 | Miller | ..................... G06F 3/064 |

* cited by examiner

MEMORY CONTROLLER AND METHOD OF OPERATING THE SAME

CROSS-REFERENCE TO RELATED APPLICATION

This application is a continuation of U.S. patent application Ser. No. 16/120,834 filed on Sep. 4, 2018, which claims benefits of priority of Korean Patent Application No. 10-2018-0012260 filed on Jan. 31, 2018. The disclosure of each of the foregoing application is incorporated herein by reference in its entirety.

BACKGROUND

Field of Invention

Various embodiments of the present disclosure generally relate to an electronic device. Particularly, the embodiments relate to a memory controller and a method of operating the memory controller.

Description of Related Art

Generally, a storage device stores data under control of a host device such as a computer, a smartphone, or a smartpad/tablet. Examples of a storage device include a hard disk drive (HDD) which stores data in a magnetic disk, and a device such as a solid state drive (SSD) and a memory card which stores data in a semiconductor memory, particularly, a nonvolatile memory.

A storage device may include a memory device to which data is stored, and a memory controller configured to store data to the memory device. The memory device may be a volatile memory or a nonvolatile memory. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the present disclosure are directed to a memory controller configured to sense an abnormal threshold voltage distribution, and a method of operating the memory controller.

An embodiment of the present disclosure may provide for a memory controller configured to perform a read operation on selected memory cells in any of an erase state and first to n-th program states (where n is a natural number greater than 1), the pairs of adjacent states being separated by respective threshold voltages, the memory controller comprising: a read fail control circuit configured to perform, when the read operation fails, an assist read operation of determining optimal read voltages to be used to read the selected memory cells, and determine whether a threshold voltage distribution of the selected memory cells is an abnormal distribution based on read-related information obtained by the read operation and the assist read operation; and an error correction code (ECC) engine configured to perform an ECC decoding operation on hard decision data obtained by reading the selected memory cells using the optimal read voltages based on whether the threshold voltage distribution of the selected memory cells is the abnormal distribution.

An embodiment of the present disclosure may provide for a method of operating a memory controller, including: performing a normal read operation on selected memory cells in any of an erase state and first to n-th program states (where n is a natural number greater than 1), of the pairs of adjacent states being separated by respective threshold voltages; performing when the normal read operation fails, an assist read operation of determining optimal read voltages to be used to read the selected memory cells; determining whether the threshold voltage distribution of the selected memory cells is the abnormal distribution based on read-related information obtained by the normal read operation and the assist read operation; and performing an error correction code (ECC) decoding operation on hard decision data obtained by reading the selected memory cells using the optimal read voltages based on whether the threshold voltage distribution of the selected memory cells is the abnormal distribution.

DETAILED DESCRIPTION

Figure 1:
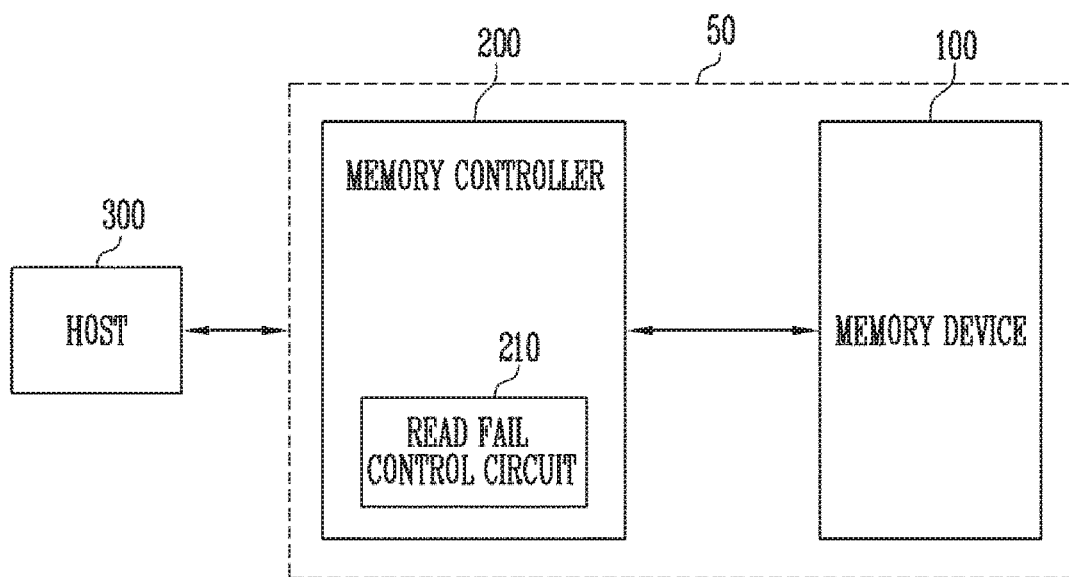
FIG. 1 is a diagram illustrating a storage device including a memory controller in accordance with an embodiment of the present disclosure.

Various embodiments will now be described in more detail with reference to the accompanying drawings; however, elements and features of the present disclosure may be configured or arranged differently than shown or described herein. Thus, the present disclosure is not limited to the embodiments set forth herein. Rather, these embodiments are provided so that this disclosure is thorough and complete and will fully convey the scope of the embodiments to those skilled in the art. It is also noted that reference to "an embodiment" or the like is not necessarily to only one embodiment, and different references to "an embodiment" or the like are not necessarily to the same embodiment(s).

In the drawing figures, dimensions may be exaggerated for clarity. It will be understood that when an element is referred to as being "between" two elements, it can be the only element between the two elements, or one or more intervening elements may also be present.

Various embodiments will be described with reference to the accompanying drawings. Embodiments and structures thereof are described with reference to sectional and schematic illustrations. As such, variations from the shapes of the illustrations as a result, for example, of manufacturing techniques and/or tolerances, are to be expected. Thus, embodiments should not be construed as limited to the particular shapes of structures and internal regions illustrated herein; rather, embodiments include deviations in shapes that result, for example, from manufacturing. In the drawings, lengths and sizes of layers and regions may be exaggerated for clarity. Like reference numerals in the drawings denote like elements.

Terms such as "first" and "second" may be used to identify various components, but they should not limit the various components. Those terms are only used for the purpose of differentiating a component from other components that otherwise have the same or similar name. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form and vice versa, unless stated or the context requires otherwise. Furthermore, "include/comprise" or "including/comprising" as used in the specification represents that one or more stated components, steps, operations, and elements are present, but any such term does not preclude the addition of one or more unstated components, operations, and/or elements.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a storage device 50 including a memory controller 200 in accordance with an embodiment of the present disclosure.

Referring to FIG. 1, the storage device 50 may include a memory device 100, and the memory controller 200.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. The memory device 100 may store data to a memory block in a sequential or random order under control of the memory controller 200. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM).

In an embodiment, the memory device 100 may be embodied in a three-dimensional (3D) array structure. The present disclosure may be applied not only to a flash memory in which a charge storage layer is formed of a conductive floating gate (FG), but also to a charge trap flash (CTF) memory in which a charge storage layer is formed of an insulating layer.

The memory device 100 may be configured to receive a command and an address from the memory controller 200 and access a region of the memory cell array which is selected by the address. In other words, the memory device 100 may perform an operation corresponding to the command on the region selected by the address. For example, the memory device 100 may perform a write (program) operation, a read operation, and an erase operation. During a program operation, the memory device 100 may program data to the region selected by the address. During a read operation, the memory device 100 may read data from the region selected by the address. During an erase operation, the memory device 100 may erase data from the region selected by the address.

The memory controller 200 may control the operation of the memory device 100 in response to a request of a host 300 or in the absence of a request of the host 300.

For example, the memory controller 200 may control the memory device 100 to perform a program operation, a read operation, or an erase operation in response to a request from the host 300. During the program operation, the memory controller 200 may provide a program command, a physical address, and data to the memory device 100. During the read operation, the memory controller 200 may provide a read command and a physical address to the memory device 100. During the erase operation, the memory controller 200 may provide an erase command and a physical address to the memory device 100.

In an embodiment, the memory controller 200 may autonomously generate a program command, an address and data without a request from the host 300, and transmit them to the memory device 100. For example, the memory controller 200 may provide a command, an address, and data to the memory device 100 to perform background operations such as a program operation for wear leveling, or a program operation for garbage collection.

The memory controller 200 may execute firmware for controlling the memory device 100. In an embodiment in which the memory device 100 is a flash memory device, the memory controller 200 may manage firmware such as a flash translation layer (FTL) for controlling communication between the host 300 and the memory device 100. In detail, the memory controller 200 may translate a logical address included in a request from the host 300 to a physical address.

In an embodiment, the memory controller 200 may include an error correction code (ECC) engine (not shown) configured to perform error bit correction. The ECC engine may include an ECC encoder and an ECC decoder. The ECC encoder may perform an error correction encoding operation on original data to be stored to the memory device 100, and generate write data with a parity bit. The parity bit may be stored in the memory device 100. The ECC decoder may perform an error correction decoding operation on data read from the memory device 100. If the number of error bits in the read data exceeds the maximum number of bits capable of being corrected by the ECC engine, the error correction decoding operation may fail. The failure of the error correction decoding operation indicates that the read operation has failed. This may indicate that the original data has not been recovered according to the read operation. On the other hand, if the number of error bits in the read data does not exceed the maximum number of bits capable of being corrected by the ECC engine, the error correction decoding operation may succeed. The success of the error correction decoding operation indicates that the read operation has passed. This may indicate that the original data has been recovered according to the read operation.

In an embodiment, if the read operation has failed, the memory controller 200 may perform a series of operations of recovering the original data. For this operation, the controller 200 may include a read fail control circuit 210.

If the read operation performed by the memory device 100 has failed, the read fail control circuit 210 may perform an operation of recovering the original data according to a predetermined defense code operation. In an embodiment, the defense code operation may include a read retry operation. Alternatively, in an embodiment, the defense code operation may include operations of reading a selected page using read voltages having different voltage levels to determine optimal read voltages (optimal read biases). As a further alternative, in an embodiment, the defense code operation may include an operation of reading a selected page using the optimal read voltages.

In an embodiment of the present disclosure, the read fail control circuit 210 may detect an abnormal threshold voltage distribution using information obtained during a process of determining the optimal read voltages. There is a high possibility of failure of the error correction decoding operation on page data having an abnormal threshold voltage distribution.

Therefore, the read fail control circuit 210 may perform an operation of detecting an abnormal threshold voltage distribution, and may omit a hard decision read operation using the optimal read voltage if the abnormal threshold voltage distribution is detected.

A method of detecting the abnormal threshold voltage distribution by the read fail control circuit 210 will be described in detail below with reference to FIGS. 4 to 9.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
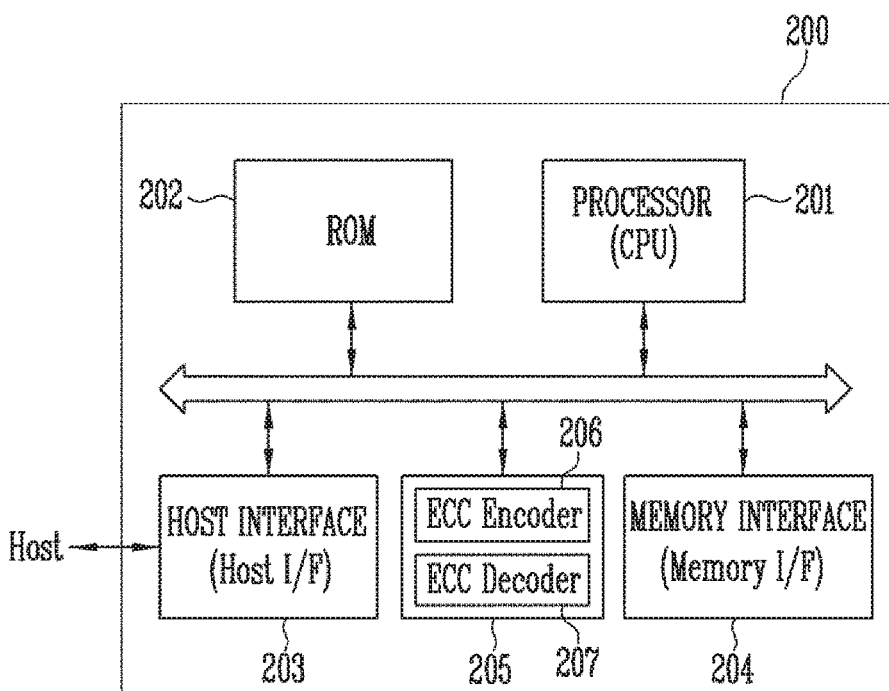
FIG. 2 is a diagram illustrating a configuration of the memory controller of FIG. 1.

FIG. 2 is a diagram illustrating a configuration of the memory controller 200 of FIG. 1.

Referring to FIG. 2, the memory controller 200 may include a processor 201, a read only memory (ROM) 202, a host interface 203, a memory interface 204, and an ECC engine 205.

The processor 201 may be embodied by a circuit, logic, a code, or a combination of them, and may control the overall operation of the storage device including the processor 201. If power is applied to the storage device 50, the processor 201 may drive the firmware stored in the ROM 202, thus controlling the overall operation of the storage device 50. Furthermore, the processor 201 may parse a command applied from the host, and control the overall operation of the memory device 100 based on the result of the parsing.

In an embodiment, the read fail control circuit 210 described with reference to FIG. 1 may be embodied in the firmware and included therein as one of functions of the firmware. In an embodiment, the read fail control circuit 210 may represent a firmware function of controlling the defense code operation.

The ROM 202 may store a firmware code for driving the storage device 50. In various embodiments, the firmware code may be stored in the memory device 100 instead of the ROM 202.

The host interface 203 may communicate with the host using at least one of various interface protocols such as a universal serial bus (USB) protocol, a multi-media card (MMC) protocol, a peripheral component interconnect-express (PCI-E) protocol, a serial-attached SCSI (SAS) protocol, a serial advanced technology attachment (SATA) protocol, a parallel advanced technology attachment (PATA) protocol, a small computer system interface (SCSI) protocol, an enhanced small disk interface (ESDI) protocol, and an integrated drive electronics (IDE) protocol.

The memory interface 204 may interface the memory controller 200 and the memory device 100 with each other. In detail, the command described with reference to FIG. 1 may be provided to the memory device 100 through the memory interface 204, and data may be transmitted from the memory controller 200 to the memory device 100 through the memory interface 204. Data output from the memory device 100 may be provided to the memory controller 200 through the memory interface 204.

The ECC engine 205 may detect and correct an error bit in data read from the memory device 100. The ECC engine 205 may include an ECC encoder 206 and an ECC decoder 207. The ECC encoder 206 may perform an error correction encoding operation on original data to be stored to the memory device 100, and generate write data with a parity bit. The parity bit may be stored to the memory device 100. The ECC decoder 207 may perform an error correction decoding operation on data read from the memory device 100. If the number of error bits in the read data exceeds the maximum number of bits capable of being corrected by the ECC engine 205, the error correction decoding operation fails. The failure of the error correction decoding operation indicates that the read operation has failed. This may indicate that the original data has not been recovered according to the read operation. On the other hand, if the number of error bits in the read data does not exceed the maximum number of bits capable of being corrected by the ECC engine 205, the error correction decoding operation succeeds. The success of the error correction decoding operation indicates that the read operation has passed. This may indicate that the original data has been recovered according to the read operation.

In an embodiment, the ECC engine 205 may correct an error using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code. However, the ECC engine 205 is not limited to these error correction techniques. Accordingly, the ECC engine 205 may include all circuits, modules, systems or devices for error correction.

Figure 3:
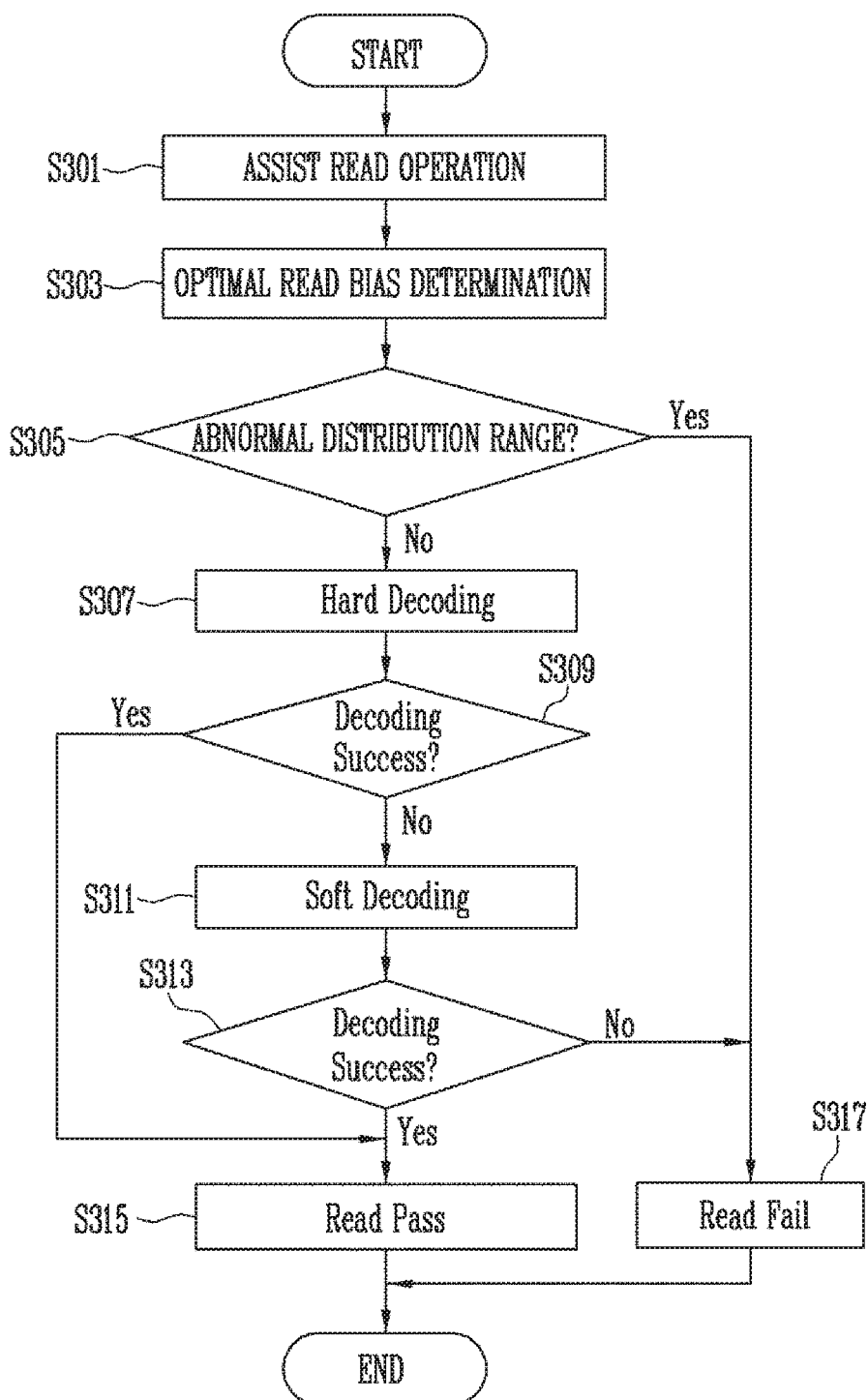
FIG. 3 is a flowchart describing an operation of the memory controller in accordance with an embodiment of the present disclosure.

FIG. 3 is a flowchart describing an operation of the memory controller 200 in accordance with an embodiment of the present disclosure.

The memory controller 200 may receive a request for reading data from a selected page of the memory device, and provide a normal read command for the selected page to the memory device. FIG. 3 is a flowchart describing an operation of the memory controller 200 which is performed when the error correction decoding operation performed on read data provided from the memory device 100 has failed.

Referring to FIG. 3, the memory controller 200 performs an assist read operation, at step S301. The assist read operation may be a read operation which is performed to determine optimal read voltages according to the defense code operation when the normal read operation has failed. In other words, the assist read operation may include any of the read operations which are performed to determine the optimal read voltages.

Various kinds of read-related information may be obtained according to the assist read operation performed at step S301 and a preceding failed read operation. The read-related information may include any one or more of cell count information about the number of ON cells, i.e., cells which are turned on or the number of OFF cells, i.e., cells which are turned off when a read voltage is applied, read voltage range information about a range of the optimal read voltages, and read voltage interval information about intervals between the optimal read voltages.

At step S303, the memory controller 200 may determine the optimal read voltages. Various schemes or methods of determining the optimal read voltages by the memory controller 200 may be used to determine the optimal read voltage. For example, the optimal read voltages may be determined using gradients of the threshold voltage distributions. Alternatively, the optimal read voltages may be determined using cell count numbers determined based on read voltages.

At step S305, the memory controller 200 may determine whether a threshold voltage distribution of selected memory cells is an abnormal distribution. A method of determining whether the threshold voltage distribution of the memory cells is an abnormal distribution will be described in detail below with reference to FIGS. 4 to 10.

When it is determined, at step S305, that the threshold voltage distribution of the memory cells is an abnormal distribution (that is, 'Yes' at step S305), the process proceeds to step S317 to output a read fail signal, without performing an error correction decoding operation, which is performed through steps S307 to S313.

When it is determined, at step S305, that the threshold voltage distribution of the memory cells is a normal distribution (that is, 'No' at step S305), the process proceeds to step S307.

At step S307, the memory controller 200 may perform a hard decoding operation. In detail, the memory controller 200 may provide, to the memory device 100, a command instructing the memory device 100 to read a selected page using the optimal read voltages. Thereafter, the memory controller 200 may perform the hard decoding operation that is an error correction decoding operation on data read using the optimal read voltages. Here, the data read using the optimal read voltages may be hard decision data.

At step S309, the memory controller 200 may determine whether the hard decoding operation has succeeded. If the number of error bits in the data read using the optimal read voltages exceeds the maximum number of correctable bits which can be corrected by the ECC engine 205, it is determined that the decoding operation has failed, and the process proceeds to step S311. If the number of error bits in the data read using the optimal read voltages does not exceed the maximum number of correctable bits which can be corrected by the ECC engine 205, it is determined that the decoding operation has succeeded, and the original data may be recovered. Hence, the process may proceed to step S315 to output a read pass signal.

At step S311, the memory controller 200 may perform a soft decoding operation. In detail, the memory controller 200 may receive, from the memory device 100, soft decision data which is probability information added to the hard decision data. The soft decision data may be data read from a selected page using read voltages different from the optimal read voltages. The memory controller 200 may perform a soft decoding operation which is an error correction decoding operation on soft decision data.

At step S313, the memory controller 200 may determine whether the soft decoding operation has succeeded. If the number of error bits in the soft decision data exceeds the maximum number of correctable bits which can be corrected by the ECC engine 205, it is determined that the decoding operation has failed, and the process proceeds to step S317 to output a read fail signal. If the number of error bits in the soft decision data does not exceed the maximum number of correctable bits which can be corrected by the ECC engine 205, it is determined that the decoding operation has succeeded, and the original data may be recovered. Hence, the process may proceed to step S315 to output a read pass signal.

Figure 4:
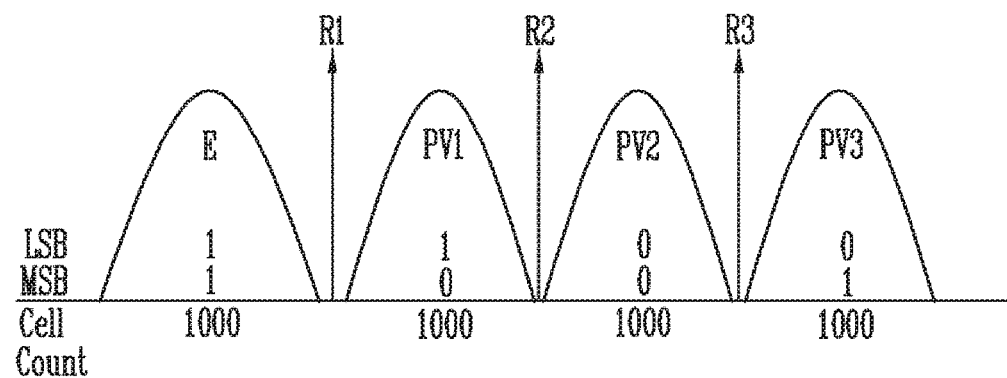
FIG. 4 is a diagram illustrating a normal threshold voltage distribution in accordance with an embodiment of the present disclosure.

FIG. 4 is a diagram illustrating a normal threshold voltage distribution in accordance with an embodiment of the present disclosure.

Referring to FIG. 4, there is illustrated a threshold voltage distribution of memory cells in a selected page. In the description with reference to FIG. 4, it is assumed that each memory cell is a multi-level cell (MLC) capable of storing 2-bit data therein. The horizontal axis refers to a threshold voltage of each memory cell, and the vertical axis refers to the number of memory cells.

Selected memory cells may be programmed to be in any one of an erase state E, a first program state PV1, a second program state PV2, and a third program state PV3.

Memory cells corresponding to the erase state E may store data "11", memory cells corresponding to the first program state PV1 may store data "10", memory cells corresponding to the second program state PV2 may store data "00", and memory cells corresponding to the third program state PV3 may store data "01".

A first read voltage R1 may be a read voltage by which the erase state E and the first program state PV1 are separated from each other. A second read voltage R2 may be a read voltage by which the first program state PV1 and the second program state PV2 are separated from each other. A third read voltage R3 may be a read voltage by which the second program state PV2 and the third program state PV3 are separated from each other.

In the ideal case, the number of memory cells corresponding to each of the erase state E, the first program state PV1, the second program state PV2, and the third program state PV3 may be the same. For example, as shown in FIG. 4, the number of memory cells corresponding to each of the erase state E, the first program state PV1, the second program state PV2, and the third program state PV3 is 1000.

Figure 5:
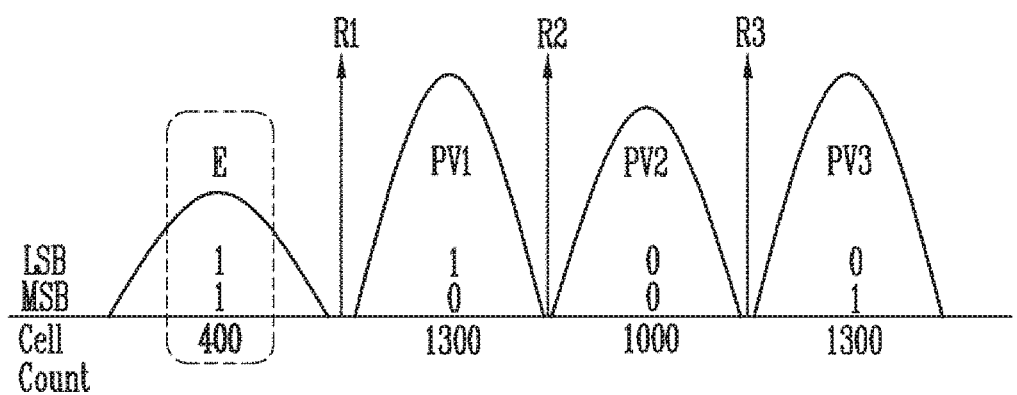
FIG. 5 is a diagram illustrating a method of sensing an abnormal distribution in accordance with an embodiment of the present disclosure.

FIG. 5 is a diagram illustrating a method of sensing an abnormal distribution in accordance with an embodiment of the present disclosure.

Referring to FIG. 5, compared to the embodiment of FIG. 4, the number of memory cells of the erase state E is reduced from 1000 to 400, and, on the other hand, the number of memory cells corresponding to each of the first program state PV1 and the third program state PV3 is increased from 1000 to 1300. The number of memory cells corresponding to the second program state PV2 remains at 1000.

The threshold voltage distribution illustrated in FIG. 5 may occur when a program operation is repeatedly performed on a page on which a program operation has been normally performed, in other words, an overwrite operation is performed.

The cell count of the memory cells of the erase state E is to be maintained at a predetermined level or more, taking into account the first read voltage R1. Although disturb loss is taken into account, the case where the cell count of the memory cells of the erase state E is less than the predetermined level may be estimated to be in an overwrite state.

Therefore, the memory controller 200 may determine whether the threshold voltage distribution of the selected memory cells is an abnormal distribution, using the cell count corresponding to each state determined by a corresponding normal read voltage. For example, if the number of memory cells corresponding to the erase state E is less than a preset reference value (e.g., 50% of a normal state), the memory controller 200 may determine that the threshold distribution of the selected memory cells is an abnormal distribution.

Figure 6:
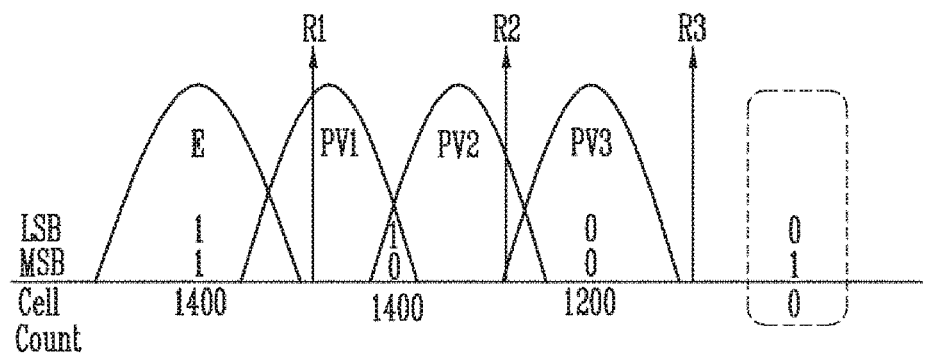
FIG. 6 is a diagram illustrating a method of sensing an abnormal distribution in accordance with an embodiment of the present disclosure.

FIG. 6 is a diagram illustrating a method of sensing an abnormal distribution in accordance with an embodiment of the present disclosure.

Referring to FIG. 6, the number of memory cells having threshold voltages lower than the first read voltage R1 is 1400, the number of memory cells having threshold voltages between the first read voltage R1 and the second read voltage R2 is 1400, the number of memory cells having threshold voltages between the second read voltage R2 and the third read voltage R3 is 1200, and the number of memory cells having threshold voltages higher than the third read voltage R3 is 0.

Generally, when a sudden power off event occurs while a program operation is performed, a program operation on memory cells having the highest program state may not be correctly performed. Therefore, when a cell count is less than a normal value based on the highest read voltage or there is no memory cell having a threshold voltage higher than the highest read voltage, it may be estimated that the sudden power off event has occurred.

Consequently, the memory controller 200 may determine whether a threshold voltage distribution of selected memory cells is an abnormal distribution, using a cell count corresponding to each state determined by a corresponding normal read voltage. For example, if the number of memory cells having threshold voltages higher than the third read voltage R3, that is, the highest read voltage, is less than a preset reference value, the memory controller 200 may determine that the threshold voltage distribution of the selected memory cells is an abnormal distribution.

Figure 7:
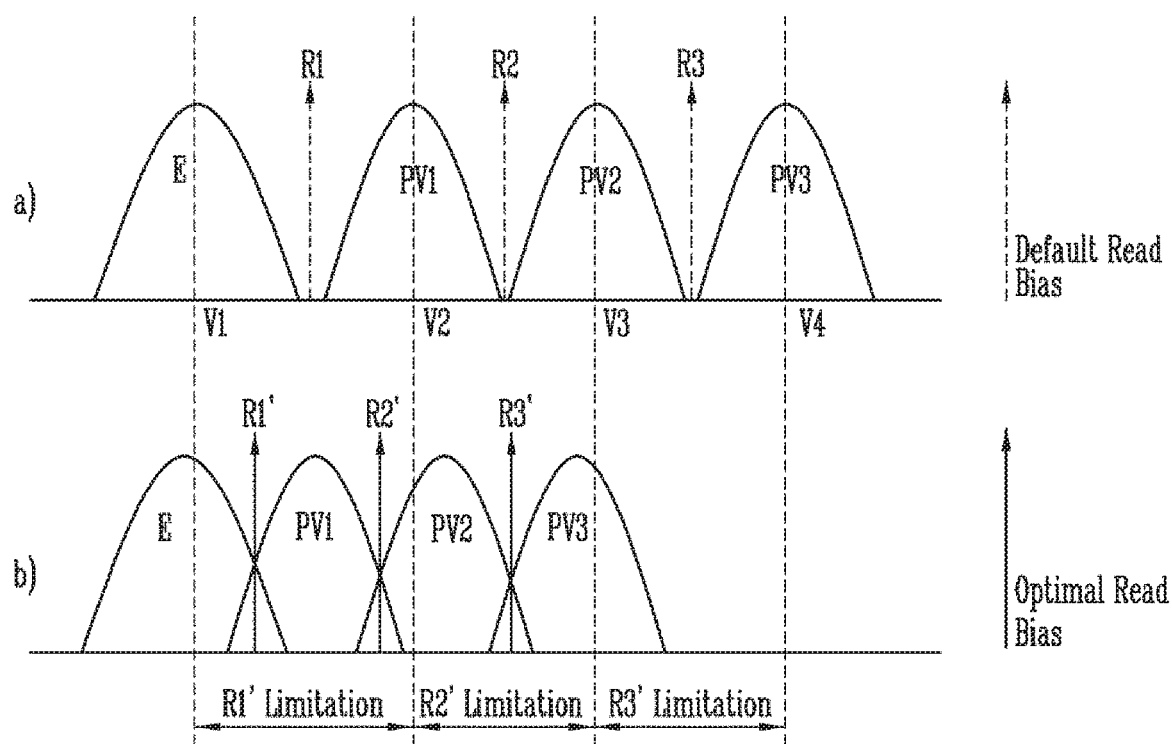
FIG. 7 is a diagram illustrating a method of sensing an abnormal distribution in accordance with an embodiment of the present disclosure.

FIG. 7 is a diagram illustrating a method of sensing an abnormal distribution in accordance with an embodiment of the present disclosure, and more particularly, a method of sensing an abnormal distribution according to a range of the optimal read voltage.

FIG. 7 a) is a diagram illustrating a threshold voltage distribution in the ideal case.

Referring to FIG. 7a), it is assumed that each memory cell is an MLC capable of storing 2-bit data therein. The horizontal axis refers to a threshold voltage of each memory cell, and the vertical axis refers to the number of memory cells.

Selected memory cells may be programmed to be in any one of an erase state E, a first program state PV1, a second program state PV2, and a third program state PV3.

A first read voltage R1 may be a read voltage by which the erase state E and the first program state PV1 are separated from each other. A second read voltage R2 may be a read voltage by which the first program state PV1 and the second program state PV2 are separated from each other. A third read voltage R3 may be a read voltage by which the second program state PV2 and the third program state PV3 are separated from each other.

Median values of respective threshold voltage distributions of the erase state E, the first program state PV1, the second program state PV2, and the third program state PV3 may be respectively a first voltage V1, a second voltage V2, a third voltage V3, and a fourth voltage V4.

FIG. 7b) is a diagram illustrating an abnormal distribution.

The memory controller 200 may determine whether the threshold voltage distribution is an abnormal distribution depending on whether each determined optimal read voltage falls within a corresponding confidence interval. Each confidence interval may be a corresponding one of ranges between the median values (i.e., between the first and second voltages V1 and V2, between the second and third voltages V2 and V3, and between the third and fourth voltages V3 and V4) of the respective threshold voltage distributions of the erase state E, the first program state PV1, the second program state PV2, and the third program state PV3 of the ideal threshold voltage distribution diagram.

In an embodiment, the confidence interval of a first optimal read voltage R1' may be a range between the first voltage V1 and the second voltage V2. The confidence interval of a second optimal read voltage R2' may be a range between the second voltage V2 and the third voltage V3. The confidence interval of a third optimal read voltage R3' may be a range between the third voltage V3 and the fourth voltage V4.

In FIG. 7b), the second optimal read voltage R2' and the third optimal read voltage R3' are outside their respective confidence intervals, so the voltage distribution is an abnormal distribution.

Figure 8:
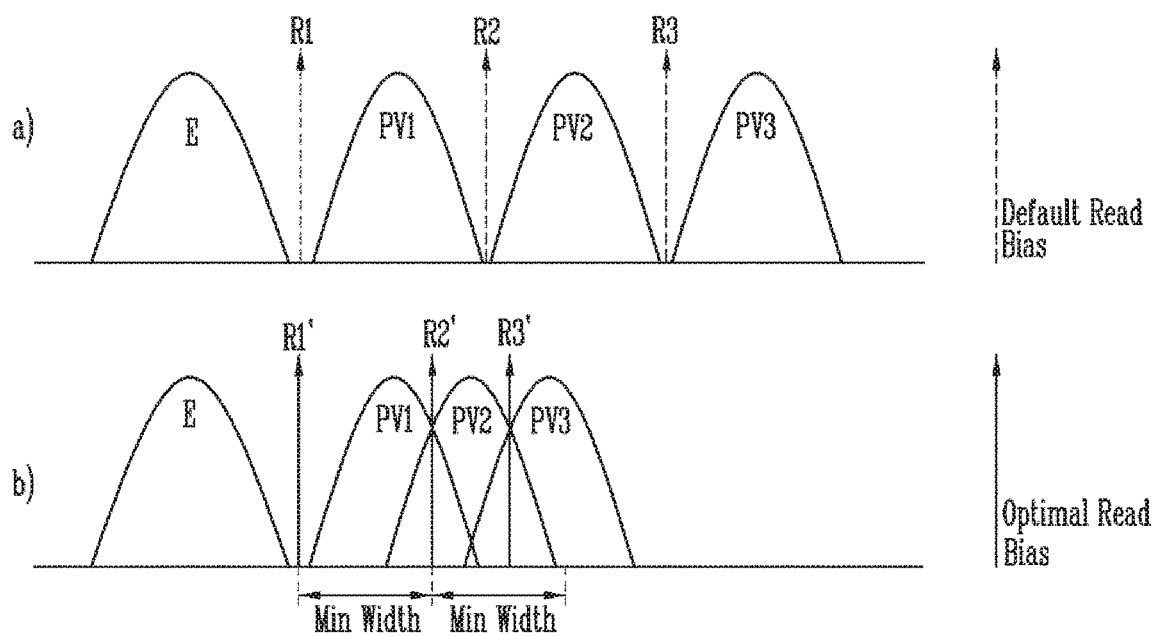
FIG. 8 is a diagram illustrating a method of sensing an abnormal distribution in accordance with an embodiment of the present disclosure.
Figure 9:
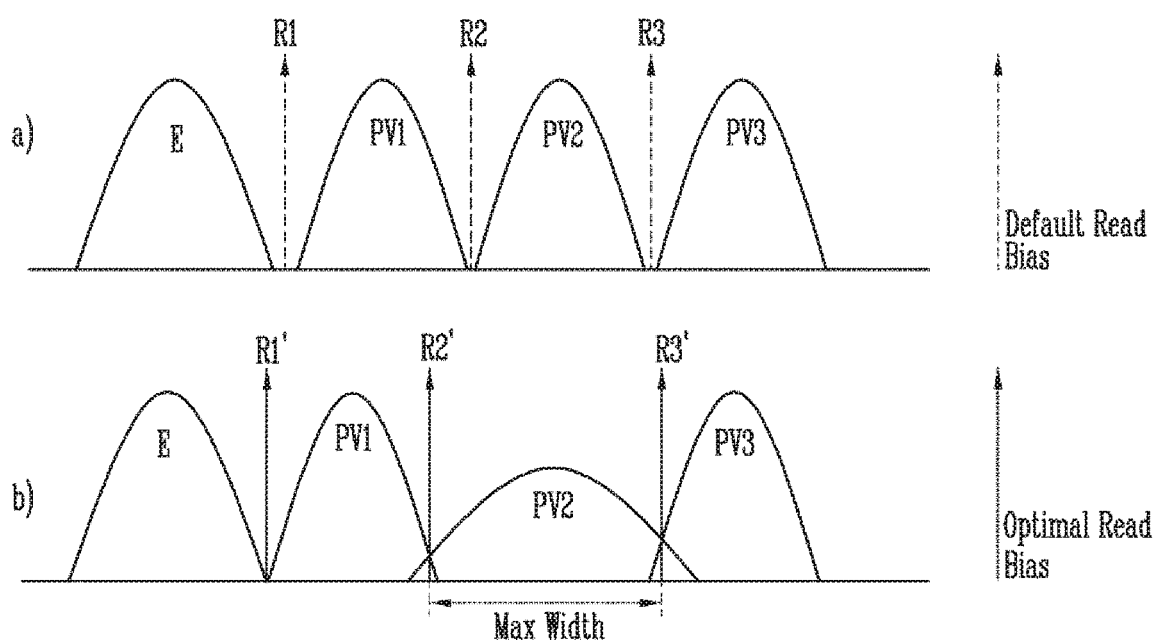
FIG. 9 is a diagram illustrating a method of sensing an abnormal distribution in accordance with an embodiment of the present disclosure.

FIGS. 8 and 9 are diagrams illustrating a method of sensing an abnormal distribution in accordance with an embodiment of the present disclosure, and more particularly, a method of sensing an abnormal distribution using intervals between optimal read voltages.

In each of FIGS. 8 and 9, a) is a diagram illustrating a threshold voltage distribution in the ideal case, and b) is a diagram illustrating an abnormal distribution.

Referring to FIGS. 8a) and 9a), it is assumed that each memory cell is an MLC capable of storing 2-bit data therein. The horizontal axis refers to a threshold voltage of each memory cell, and the vertical axis refers to the number of memory cells.

Selected memory cells may be programmed to be included in any one of an erase state E, a first program state PV1, a second program state PV2, and a third program state PV3.

A first read voltage R1 may be a read voltage by which the erase state E and the first program state PV1 are separated from each other. A second read voltage R2 may be a read voltage by which the first program state PV1 and the second program state PV2 are separated from each other. A third read voltage R3 may be a read voltage by which the second program state PV2 and the third program state PV3 are separated from each other.

The memory controller 200 may determine whether the threshold voltage distribution is an abnormal distribution depending on whether or not each of the intervals between determined optimal read voltages is less than the minimum width or greater than the maximum width.

Generally, when a sudden power off event occurs while a program operation is performed, the width of the threshold voltage distribution of a relatively high program state (e.g., PV2 or PV3) is reduced compared to that of a normal distribution. Alternatively, the optimal read voltage interval may not be constant.

Hence, when the interval between the determined optimal read voltages is less than the minimum width or greater than the maximum width, the memory controller 200 may determine that the threshold voltage distribution is an abnormal distribution.

FIG. 8b) illustrates the case where the interval between the second optimal read voltage R2' and the third optimal read voltage R3' is less than the minimum width. FIG. 9b) illustrates the case where the interval between the second optimal read voltage R2' and the third optimal read voltage R3' is greater than the maximum width.

Figure 10:
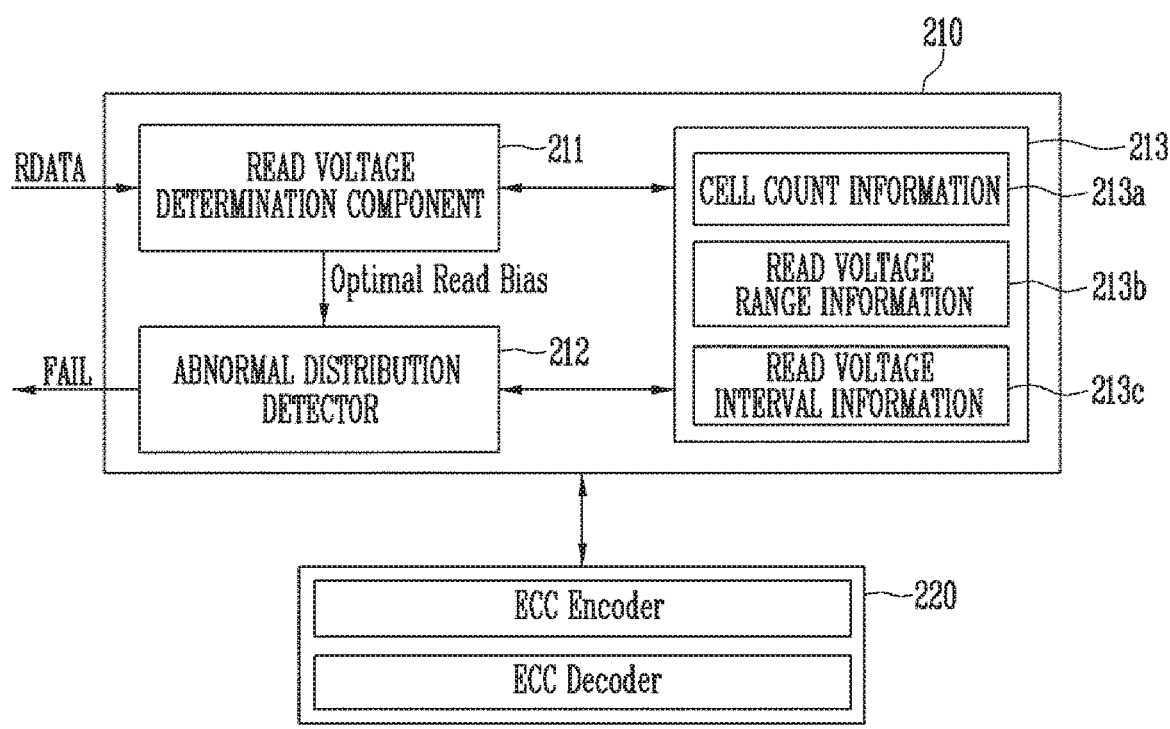
FIG. 10 is a block diagram illustrating a configuration of a read fail control circuit of FIG. 1.

FIG. 10 is a block diagram illustrating a configuration of the read fail control circuit 210 of FIG. 1.

Referring to FIG. 10, the read fail control circuit 210 may include a read voltage determination component 211, an abnormal-distribution detector 212, and a read information storage 213.

If a normal read operation fails, the read voltage determination component 211 may determine optimal read voltages or optimal read biases using an assist read operation. In detail, the read voltage determination component 211 may receive read data RDATA from the memory device 100. The read data RDATA may be data read from selected memory cells using normal read voltages. Alternatively, the read data RDATA may be data read from the selected memory cells using assist read voltages. The read data RDATA may be data read from the selected memory cells using optimal read voltages. The read voltage determination component 211 may store, to the read information storage 213, a cell count 213a obtained through the normal read operation, the assist read operation, or the read operation using the optimal read voltage.

The read voltage determination component 211 may provide the determined optimal read voltages to the abnormal-distribution detector 212.

The abnormal-distribution detector 212 may receive the optimal read voltages from the read voltage determination component 211. The abnormal-distribution detector 212 may determine whether a threshold voltage distribution of selected memory cells is an abnormal distribution, based on the optimal read voltages and the read-related information 213a to 213c stored in the read information storage 213. When an abnormal distribution is detected, the abnormal-distribution detector 212 may output a read fail signal FAIL.

In an embodiment, the abnormal-distribution detector 212 may determine whether the threshold voltage distribution of the selected memory cells is an abnormal distribution, using the cell count information 213a corresponding to each state determined by a corresponding normal read voltage. For example, if the number of memory cells corresponding to the erase state E is less than a preset reference value (e.g., 50% of a normal state), the abnormal-distribution detector 212 may determine that the threshold distribution of the selected memory cells is an abnormal distribution.

In an embodiment, the abnormal-distribution detector 212 may determine whether the threshold voltage distribution of the selected memory cells is an abnormal distribution, using the cell count information 213a corresponding to each state determined by a corresponding normal read voltage. For example, if the number of memory cells having threshold voltages higher than the third read voltage R3 that is the highest read voltage is less than a preset reference value, the abnormal-distribution detector 212 may determine that the threshold voltage distribution of the selected memory cells is an abnormal distribution.

In an embodiment, the abnormal-distribution detector 212 may determine whether the threshold voltage distribution is an abnormal distribution depending on whether each optimal read voltage fall within a corresponding confidence interval. Each confidence interval may be a corresponding one of ranges between the median values (e.g., between the first and second voltages V1 and V2, between the second and third voltages V2 and V3 and between the third and fourth voltages V3 and V4 as shown in FIG. 7) of the respective threshold voltage distributions of the erase state E, the first program state PV1, the second program state PV2, and the third program state PV3 of the ideal threshold voltage distribution diagram. The confidence interval may be previously stored in the read voltage range information 213b of the read information storage unit 213. If the optimal read voltage is not within the corresponding confidence interval, the abnormal-distribution detector 212 may determine that the threshold voltage distribution of the selected memory cells is an abnormal distribution.

In an embodiment, the abnormal-distribution detector 212 may determine whether the threshold voltage distribution is an abnormal distribution depending on an interval between optimal read voltages (e.g., the first to third optimal read voltages R1' to R3' shown in FIGS. 8 and 9). For example, when the interval between the determined optimum read voltages is less than the minimum width or greater than the maximum width, as described with reference to FIGS. 8 and 9, the memory abnormal-distribution detector 212 may determine that the threshold voltage distribution is an abnormal distribution. The minimum width and the maximum width may be previously stored in the read voltage interval information 213*c* of the read information storage 213.

The read information storage 213 may store the read-related information 213*a* to 213*c* therein. The read-related information 213*a* to 213*c* may be obtained as a read operation is performed. Alternatively, the read-related information 213*a* to 213*c* may be previously stored.

The read information storage 213 may store at least one of the cell count information 213*a*, the read voltage range information 213*b*, and the read voltage interval information 213*c*.

The cell count information 213*a* may be information about the number of ON cells turned on when a read voltage is applied, or the number of OFF cells turned off.

The read voltage range information 213*b* may be information about confidence intervals within which optimal read voltages are present.

The read voltage interval information 213*c* may be information about the minimum width and the maximum width between optimal read voltages.

In an embodiment, the read fail control circuit 210 may provide hard decision data or soft decision data to an ECC engine 220. The ECC engine 220 may be the ECC engine 205 described with reference to FIG. 2. An ECC decoder may perform a hard decoding operation on the hard decision data or a soft decoding operation on the soft decision data, and may provide a result thereof to the read fail control circuit 210.

In an embodiment of the present disclosure, the memory controller 200 may sense whether a threshold voltage distribution of selected memory cells is an abnormal distribution. If the threshold voltage distribution is an abnormal distribution, the memory controller 200 may process the read operation as a read fail without performing an error correction decoding operation, thus preventing a redundant error correction decoding operation from being performed.

In various embodiments, the memory controller 200 may apply an error processing operation in different ways depending on the type of abnormal distribution. For example, when an error is determined to have occurred when a sudden power off (SPO) event has occurred, among the cases where abnormal distributions are detected, an operation of coping with the SPO event is performed, whereby the corresponding memory block may be prevented from being processed as a bad block. If an error is determined not to have occurred when an SPO event has occurred, among the cases where abnormal distributions are detected, the corresponding memory block may be processed as a bad block.

Figure 11:
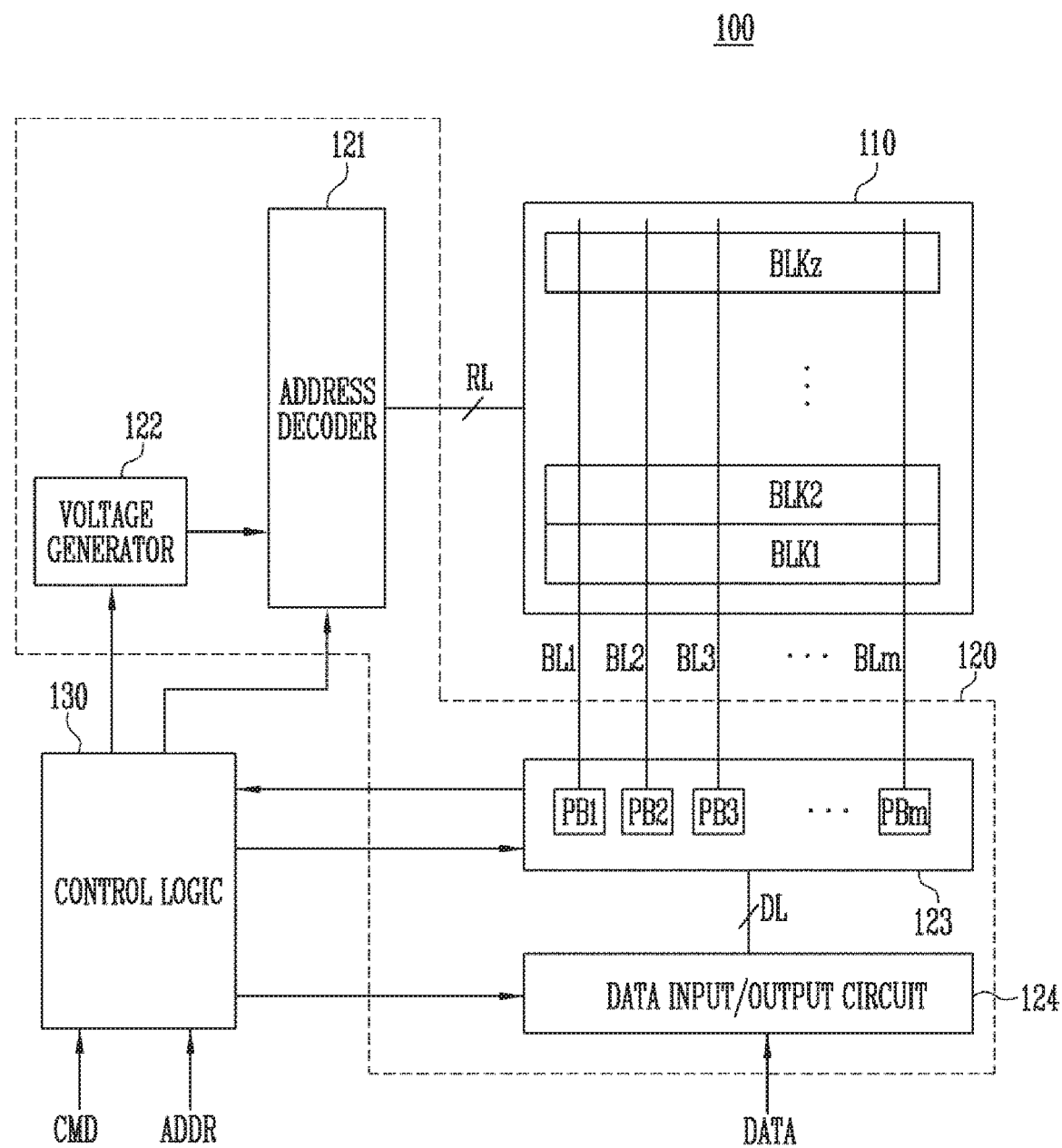
FIG. 11 is a diagram illustrating a configuration of the memory device of FIG. 1.

FIG. 11 is a diagram illustrating a configuration of the memory device 100 of FIG. 1.

Referring to FIG. 11, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to the address decoder 121 through row lines RL. The memory blocks BLK1 to BLKz may be coupled to the read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line may be defined as one page. In other words, the memory cell array 110 is formed of a plurality of pages. In an embodiment, each of the memory blocks BLK1 to BLKz in the memory cell array 110 may include a plurality of dummy cells. One or more dummy cells may be coupled in series between a drain select transistor and memory cells and between a source select transistor and the memory cells.

Each of the memory cells of the memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, a read/write circuit 123, and a data input/output circuit 124.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under control of the control logic 130. The address decoder 121 receives addresses ADDR from the control logic 130.

The address decoder 121 may decode a block address among the received addresses ADDR. The address decoder 121 selects at least one of the memory blocks BLK1 to BLKz according to the decoded block address. The address decoder 121 may decode a row address among the received addresses ADDR. The address decoder 121 may select at least one word line WL of the selected memory block by applying voltages supplied from the voltage generator 122 to the word line(s) WL according to the decoded row address.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage higher than the verify voltage to unselected word lines.

During a read operation, the address decoder 121 may apply a read voltage to a selected word line and apply a pass voltage higher than the read voltage to unselected word lines.

In an embodiment, an erase operation of the memory device 100 may be performed on a memory block basis. During the erase operation, an address ADDR to be inputted to the memory device 100 includes a block address. The address decoder 121 may decode the block address and select a corresponding one memory block according to the decoded block address. During the erase operation, the address decoder 121 may apply a ground voltage to word lines coupled to the selected memory block.

In an embodiment, the address decoder 121 may decode a column address among the transmitted addresses ADDR. A decoded column address DCA may be transmitted to the read/write circuit 123. In an embodiment, the address decoder 121 may include components such as a row decoder, a column decoder, and an address buffer.

The voltage generator 122 may generate a plurality of voltages using an external power voltage supplied to the memory device 100. The voltage generator 122 is operated under control of the control logic 130.

In an embodiment, the voltage generator 122 may generate an internal supply voltage by regulating an external supply voltage. The internal supply voltage generated from the voltage generator 122 may be used as an operating voltage of the memory device 100.

In an embodiment, the voltage generator 122 may produce a plurality of voltages using the external supply voltage or the internal supply voltage. The voltage generator 122 may generate various voltages required in the memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage, and generate a plurality of voltages by selectively enabling the plurality of pumping capacitors under control of the control logic 130.

The generated voltages may be supplied to the memory cell array 110 by the address decoder 121.

The read/write circuit 123 may include first to m-th page buffers PB1 to PBm, which are coupled to the memory cell array 110 through the first to m-th bit lines BL1 to BLm, respectively. The first to m-th page buffers PB1 to PBm may operate under control of the control logic 130.

The first to m-th page buffers PB1 to PBm may perform data communication with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program allowable voltage (e.g., a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read page data from selected memory cells through the bit lines BL1 to BLm.

During a read operation, the read/write circuit 123 may read data DATA from the memory cells in the selected page through the bit lines BL, and output the read data DATA to the data input/output circuit 124.

During an erase operation, the read/write circuit 123 may float the bit lines BL. In an embodiment, the read/write circuit 123 may include a row select circuit.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not shown) which receive input data. During a program operation, the data input/output circuit 124 may receive data DATA to be stored from an external controller (not shown). During a read operation, the data input/output circuit 124 may output, to the external controller, the data received from the first to m-th page buffers PB1 to PBm in the read/write circuit 123.

The control logic 130 may be coupled to the address decoder 121, the voltage generator 122, the read/write circuit 123, and the data input/output circuit 124. The control logic 130 may control the overall operation of the memory device 100. The control logic 130 may operate in response to a command CMD transmitted from an external device.

Figure 12:
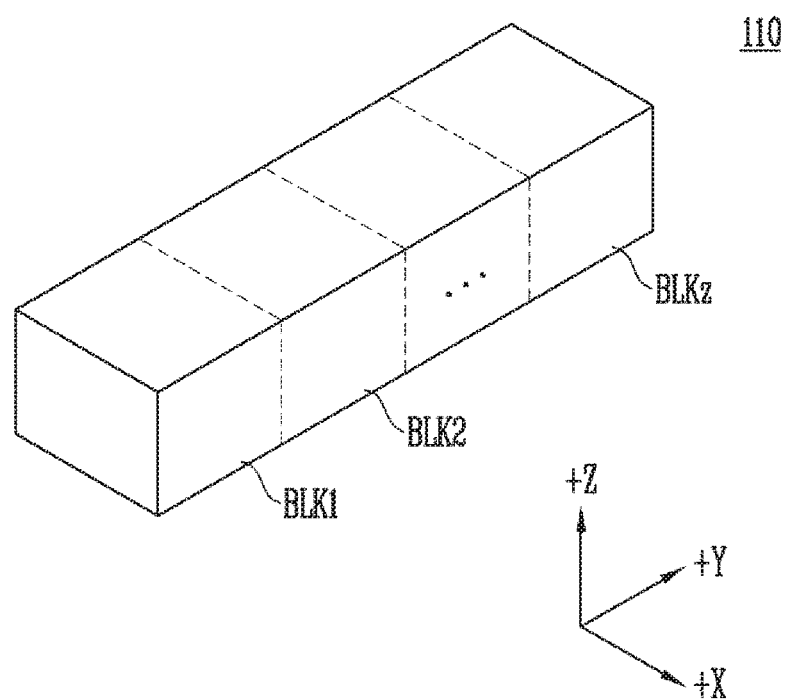
FIG. 12 is a diagram illustrating an example of a memory cell array of FIG. 11.

FIG. 12 is a diagram illustrating an example of a memory cell array 110 of FIG. 11.

Referring to FIG. 12, the memory cell array 110 may include a plurality of memory blocks BLK1 to BLKz. Each memory block may have a three-dimensional (3D) structure. Each memory block may include a plurality of memory cells stacked on a substrate. The memory cells are arranged in a +X direction, a +Y direction, and a +Z direction. The structure of each memory block will be described in more detail with reference to FIGS. 13 and 14.

Figure 13:
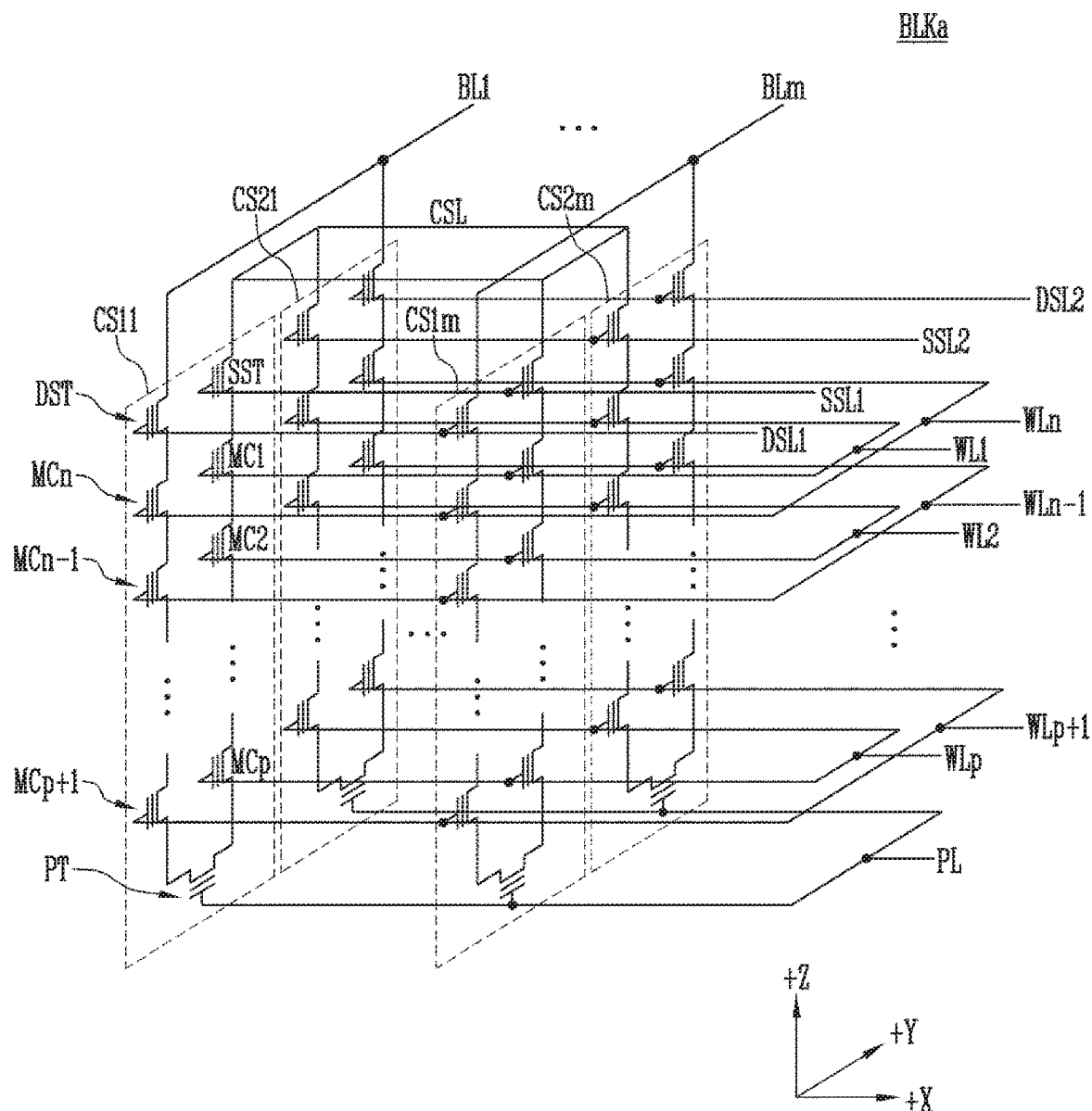
FIG. 13 is a circuit diagram illustrating any one (BLKa) of memory blocks (BLK1) to (BLKz) of FIG. 12 in accordance with an embodiment of the present disclosure.

FIG. 13 is a circuit diagram illustrating any one BLKa of memory blocks BLK1 to BLKz of FIG. 12 in accordance with an embodiment of the present disclosure.

Referring to FIG. 13, the memory block BLKa may include a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings may be arranged in a row direction (i.e., the +X direction). In FIG. 13, two cell strings are illustrated as being arranged in a column direction (i.e., the +Y direction). However, this illustration is made for clarity; it will be understood that three or more cell strings may be arranged in the column direction.

Each of the plurality of cell strings CS11 to CS1*m* and CS21 to CS2*m* may include at least one source select transistor SST, first to n-th memory cells MC1 to MCn, each of which may have a similar structure, a pipe transistor PT, and at least one drain select transistor DST.

The select transistors SST and DST may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 13, source select transistors of the cell strings CS11 to CS1*m* in a first row are coupled to a first source select line SSL1. Source select transistors of the cell strings CS21 to CS2*m* in a second row are coupled to a second source select line SSL2.

In an embodiment, the source select transistors of the cell strings CS11 to CS1*m* and CS21 to CS2*m* may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a −Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 9, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting any one of the drain select lines DSL1 and DSL2. One page may be selected from among the selected cell strings by selecting any one of the word lines WL1 to WLn.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to respective even bit lines. Odd-number-th cell strings of the cell strings CS11 to CS1m or CS21 to CS2m arranged in the row direction may be coupled to respective odd bit lines.

In an embodiment, one or more of the first to n-th memory cells MC1 to MCn may be used as a dummy memory cell. For example, the dummy memory cell(s) may be provided to reduce an electric field between the source select transistor SST and the memory cells MC1 to MCp. Alternatively, the dummy memory cell(s) may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a threshold voltage. Before or after an erase operation on the memory block BLKa is performed, program operations may be performed on all or some of the dummy memory cells. In the case where an erase operation is performed after a program operation has been performed, the dummy memory cells may have threshold voltages by controlling a voltage to be applied to the dummy word lines coupled to the respective dummy memory cells.

Figure 14:
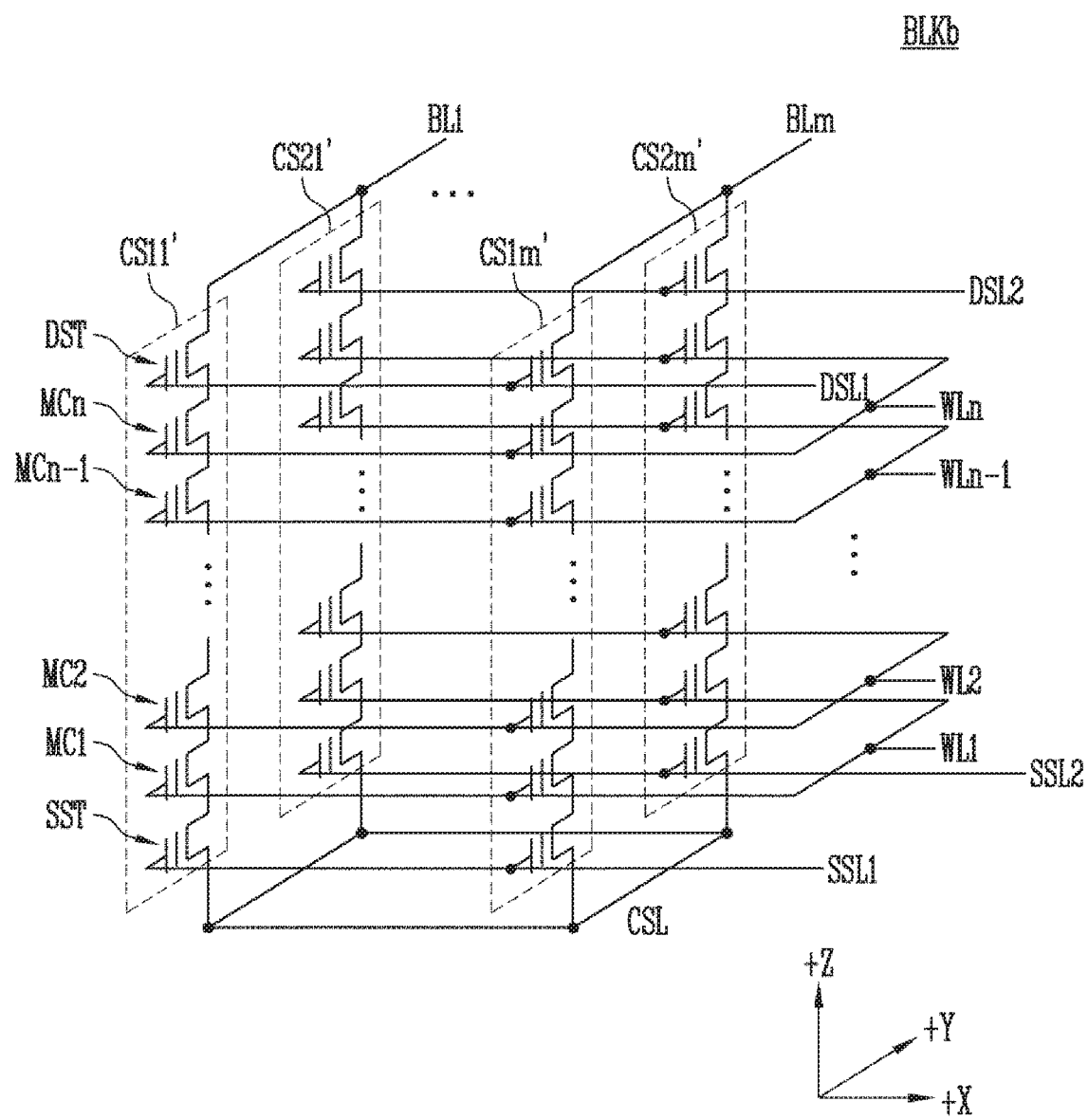
FIG. 14 is a circuit diagram illustrating any one (BLKb) of the memory blocks (BLK1) to (BLKz) of FIG. 12 in accordance with an embodiment of the present disclosure.

FIG. 14 is a circuit diagram illustrating any one BLKb of memory blocks BLK1 to BLKz of FIG. 12 in accordance with an embodiment of the present disclosure.

Referring to FIG. 14, a memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequentially, the memory block BLKb of FIG. 14 may have an equivalent circuit similar to that of the memory block BLKa of FIG. 13 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, one or more of the first to n-th memory cells MC1 to MCn may be used as a dummy memory cell. For example, the dummy memory cell(s) may be provided to reduce an electric field between the source select transistor SST and the memory cells MC1 to MCn. Alternatively, the dummy memory cell(s) may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the dummy memory cell(s), each of the dummy memory cells may have a threshold voltage. Before or after an erase operation on the memory block BLKb is performed, program operations may be performed on all or some of the dummy memory cells. In the case where an erase operation is performed after a program operation has been performed, the dummy memory cells may have threshold voltages by controlling a voltage to be applied to the dummy word lines coupled to the respective dummy memory cells.

Figure 15:
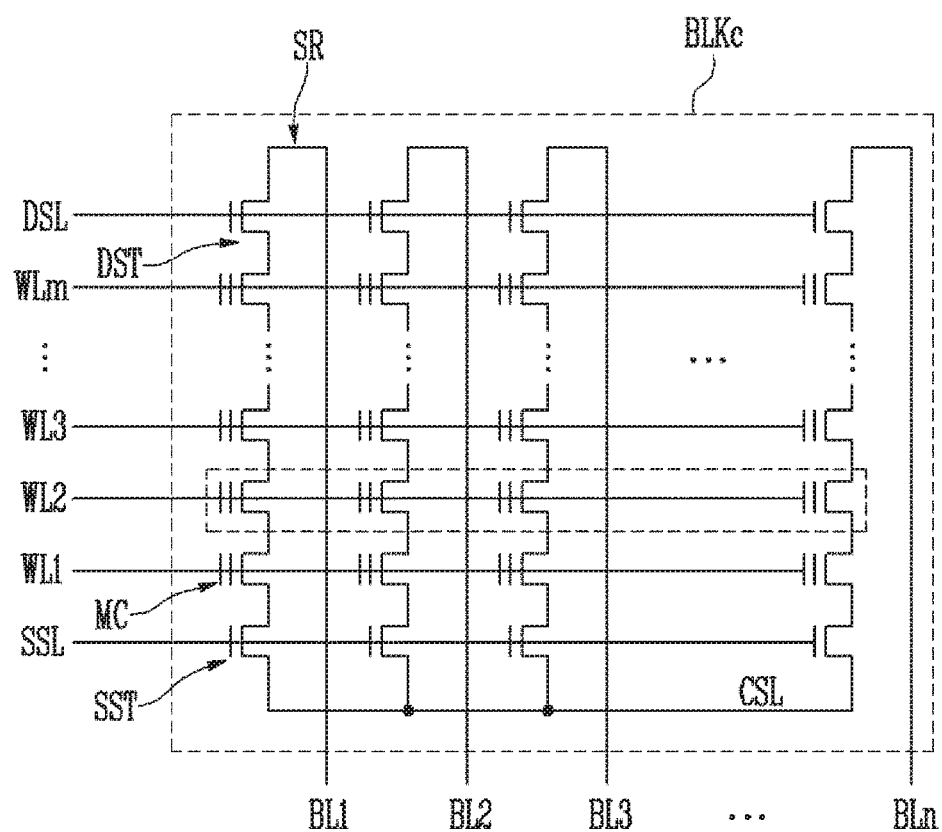
FIG. 15 is a circuit diagram illustrating any one (BLKc) of the memory blocks (BLK1) to (BLKz) in the memory cell array of FIG. 11 in accordance with an embodiment of the present disclosure.

FIG. 15 is a circuit diagram illustrating any one BLKc of the memory blocks BLK1 to BLKz in the memory cell array 110 of FIG. 11 in accordance with an embodiment of the present disclosure.

Referring to FIG. 15, the memory block BKLc may include a plurality of strings SR. The plurality of strings SR may be respectively coupled to a plurality of bit lines BL1 to BLn. Each string SR may include a source select transistor SST, memory cells MC, and a drain select transistor DST.

The source select transistor SST of each string SR may be coupled between the memory cells MC and a common source line CSL. The source select transistors SST of the strings SR may be coupled in common to the common source line CSL.

The drain select transistor DST of each string SR may be coupled between the memory cells MC and the corresponding bit line BL. The drain select transistors DST of the strings SR may be respectively coupled the bit lines BL1 to BLn.

In each string SR, a plurality of memory cells MC may be provided between the source select transistor SST and the drain select transistor DST. In each string SR, the memory cells MC may be coupled in series with each other.

In the strings SR, memory cells MC disposed in the same turn from the common source line CSL may be coupled in common to a single word line. The memory cells MC of the strings SR may be coupled to a plurality of word lines WL1 to WLm.

In the memory block BLKc, an erase operation may be performed on a memory block basis. When the erase operation is performed on a memory block basis, all memory cells of the memory block BLKc may be simultaneously erased in response to an erase request.

Figure 16:
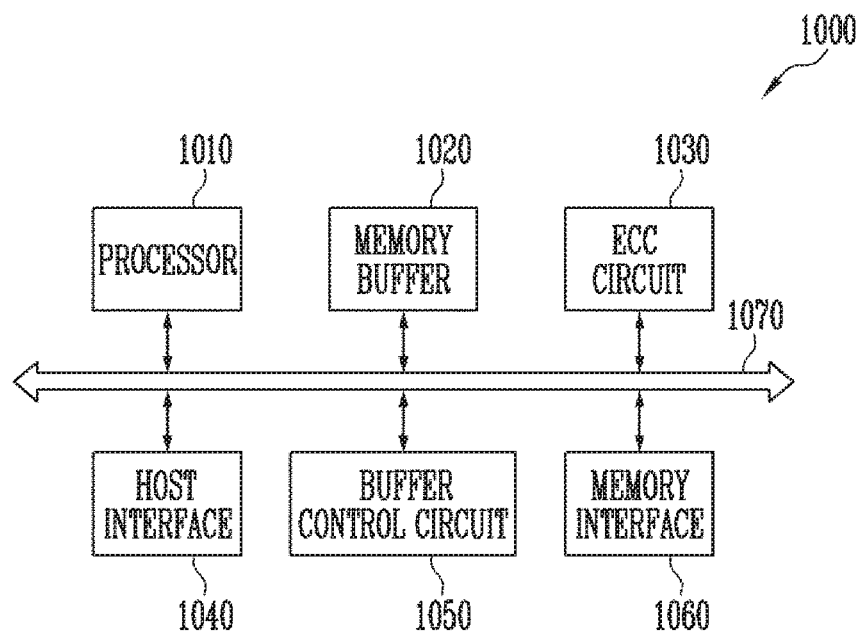
FIG. 16 is a diagram illustrating an example of the memory controller of FIG. 1 in accordance with an embodiment of the present disclosure.

FIG. 16 is a diagram illustrating an example of the memory controller 200 of FIG. 1 in accordance with an embodiment of the present disclosure.

The memory controller 1000 is coupled to the host and the memory device 100. In response to a request from the host, the controller 1000 may access the memory device 100. For example, the memory controller 1000 may control a write operation, a read operation, an erase operation, and a background operation of the memory device 100. The memory controller 1000 may provide an interface between the memory device 100 and the host. The memory controller 1000 may drive firmware for controlling the memory device 100.

Referring to FIG. 16, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device 100 through the memory interface 1060. In addition, the processor 1010 may communicate with the memory buffer 1020 through the buffer control circuit 1050. The processor 1010 may control the operation of the storage device 50 using the memory buffer 1020 as an operation memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. An address mapping method using the FTL may be modified in various ways based on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device 100 as data to be stored, and may be programmed to the memory cell array.

During a read operation, the processor 1010 may derandomize data received from the memory device 100. For example, the processor 1010 may use a derandomizing seed to derandomize data received from the memory device 100. Derandomized data may be output to the host.

In an embodiment, the processor 1010 may drive software or firmware to perform the randomizing operation or the derandomizing operation.

In an embodiment, the processor 1010 may perform an abnormal-distribution sensing operation of the read fail control circuit 210 described with reference to FIG. 1.

The memory buffer 1020 may be used as an operation memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device 100 through the memory interface 1060. ECC encoded data may be transmitted to the memory device 100 through the memory interface 1060. The ECC circuit 1030 may perform an ECC decoding operation on data received from the memory device 100 through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM).

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device 100 through the channel provided by the bus 1070.

For example, the memory controller 1000 may include neither the memory buffer 1020 nor the buffer control circuit 1050, one or both of which may be provided separately, or their functions may be distributed among one or more other components in the system.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device 100 through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other so as not to interfere or affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 17:
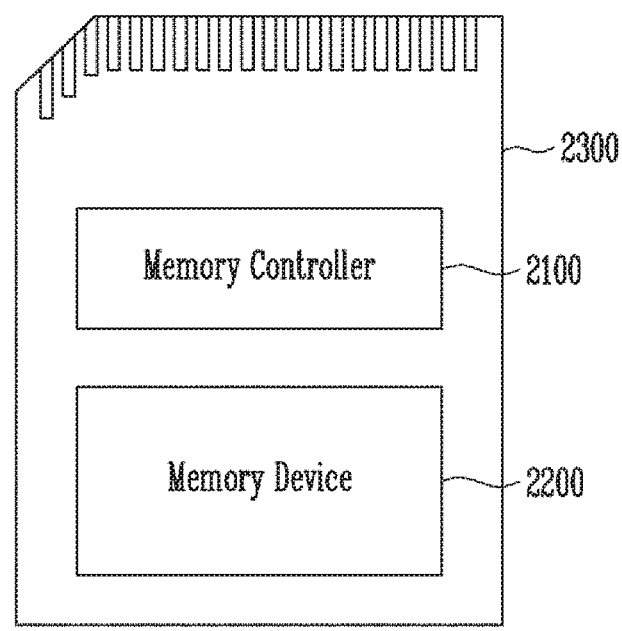
FIG. 17 is a block diagram illustrating a memory card system to which a storage device in accordance with an embodiment of the present disclosure is applied.

FIG. 17 is a block diagram illustrating a memory card system 2000 to which a storage device in accordance with an embodiment of the present disclosure is applied.

Referring FIG. 17, the memory card system 2000 may include a memory controller 2100, a memory device 2200 and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2100 and the host. The memory controller 2100 may drive firmware for controlling the memory device 2200. The memory controller 2100 may be configured in the same manner as that of the memory controller 200 described with reference to FIG. 1.

In an embodiment, the memory controller 2100 may include components such as a random access memory (RAM), a processor, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card such as a personal computer memory card international association (PCM-CIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 18:
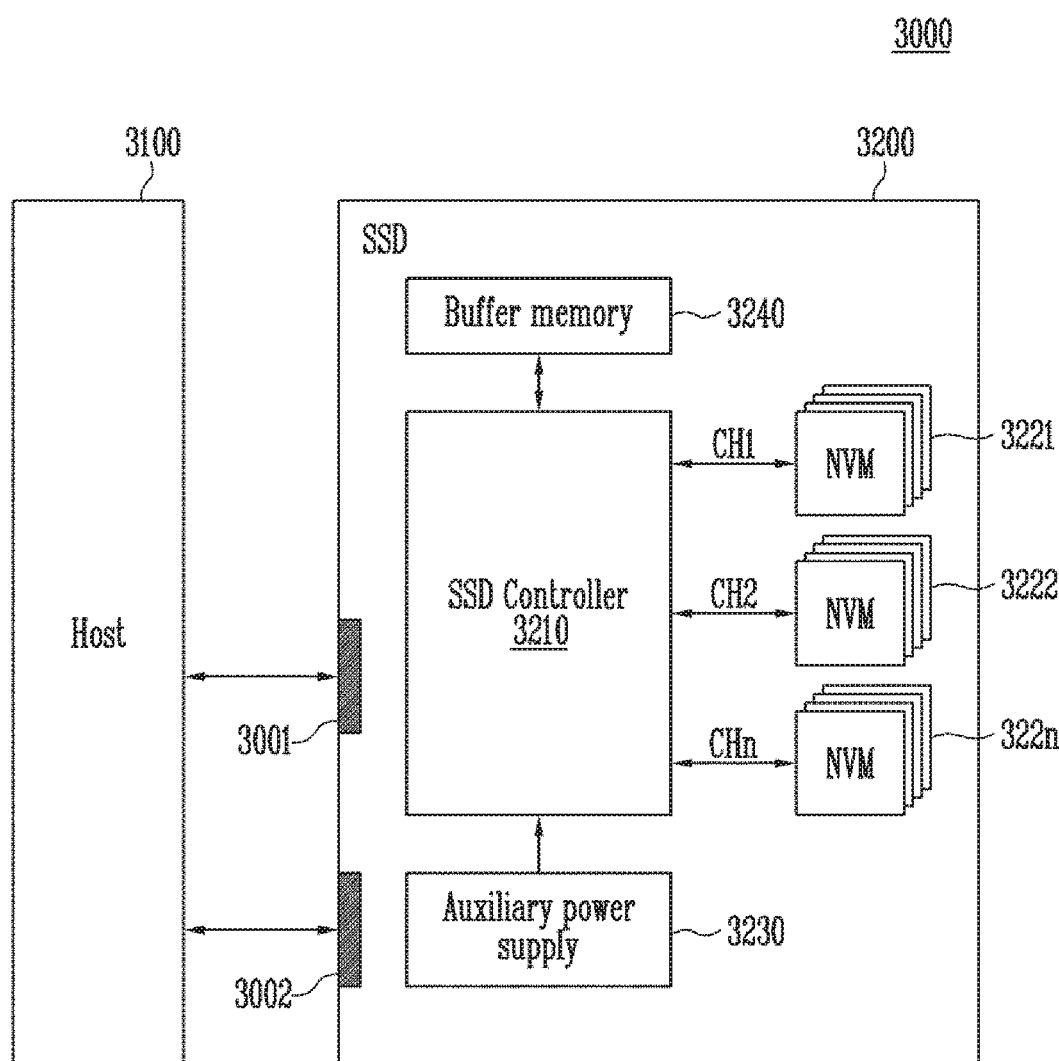
FIG. 18 is a block diagram illustrating a solid state drive (SSD) system to which the storage device in accordance with an embodiment of the present disclosure is applied.

FIG. 18 is a block diagram illustrating a solid state drive (SSD) system 3000 to which the storage device in accordance with an embodiment of the present disclosure is applied.

Referring to FIG. 18, the SSD system 3000 may include a host 3100 and an SSD 3200. The SSD 3200 may exchange signals with the host 3100 through a signal connector 3001 and may receive power through a power connector 3002. The SSD 3200 may include an SSD controller 3210, a plurality of flash memories 3221 to 322$n$, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322$n$ in response to the signals received from the host 3100. In an embodiment, the signals may be based on the interfaces of the host 3100 and the SSD 3200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power from the host 3100 and may be charged. The auxiliary power supply 3230 may supply the power of the SSD 3200 when the supply of power from the host 3100 is not smoothly delivered. In an embodiment, the auxiliary power supply 3230 may be positioned inside the SSD 3200 or externally to the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322$n$ or may temporarily store metadata (e.g., mapping tables) of the flash memories 3221 to 322$n$. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 19:
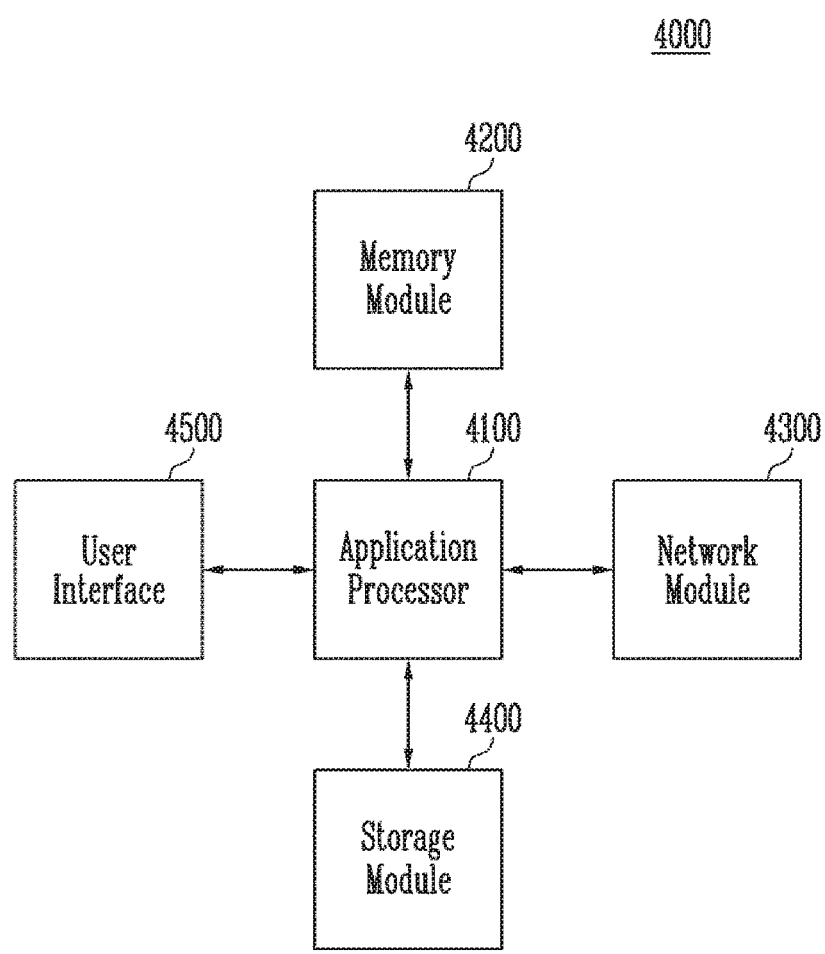
FIG. 19 is a block diagram illustrating a user system to which the storage device in accordance with an embodiment of the present disclosure is applied.

FIG. 19 is a block diagram illustrating a user system 4000 to which the storage device in accordance with an embodiment of the present disclosure is applied.

Referring to FIG. 19, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, and LPDDR3 SDRAM, or nonvolatile RAMs such as PRAM, ReRAM, MRAM, and FRAM. In an embodiment, the application processor 4100 and the memory module 4200 may be packaged as package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 400.

In an embodiment, the storage module 4400 may include a plurality of nonvolatile memory devices, and each of the plurality of nonvolatile memory devices may be operated in the same manner as that of the memory device 100, described above with reference to FIGS. 11 and 15. The storage module 4400 may be operated in the same manner as that of the storage device 50, described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an a liquid crystal display (LCD), an organic light emitting diode (OLED) display device, an active matrix OLED (AMOLED) display device, an LED, a speaker, and a motor.

Various embodiments of the present disclosure are directed to a memory controller configured to sense an abnormal threshold voltage distribution, and a method of operating the memory controller.

While embodiments of the present disclosure have been disclosed for illustrative purposes, those skilled in the art will appreciate, in light of the foregoing disclosure, that various modifications, additions and substitutions are possible. Therefore, the scope of the present disclosure is defined by the appended claims and equivalents of the claims rather than by the description preceding them.

In the above-discussed embodiments, steps may be selectively performed or skipped. In addition, the steps in each embodiment need not be performed in the disclosed order. More generally, the disclosed embodiments aim to help those skilled in this art to more clearly understand the present disclosure, not to limit the bounds of the present disclosure. One skilled in the art will understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein still fall within the spirit and scope of the present disclosure as defined in the appended claims and their equivalents.

What is claimed is:

1. An operating method of a memory system, comprising:
    performing a read operation on memory cells having a threshold voltage distribution in response to a read request; and
    outputting a signal indicating a failure of the read operation, without performing a soft decoding operation corresponding to the read operation, based on an abnormality of the threshold voltage distribution,
    wherein the read operation comprises:
    performing a default read operation with a default read voltage on the memory cells;
    in response to a failure of the default read operation, searching a new read voltage by evaluating a shift of the threshold voltage distribution of the memory cells using a predetermined algorithm, the predetermined algorithm comprising performing one or more read operations with one or more predetermined read voltages, which are different from the default read voltage, on the memory cells; and
    determining the abnormality of the threshold voltage distribution based on the default read voltage and the new read voltage.

2. The operating method according to claim 1, wherein the abnormality of the threshold voltage distribution is determined based on whether the new read voltage falls within a voltage range defined by the default read voltage and a predetermined voltage value.

3. The operating method according to claim 1, wherein the predetermined algorithm further comprises counting a number of memory cells included in a threshold voltage interval defined by the one or more read operations.

4. An operating method of a memory system, comprising:
performing a read operation on memory cells having a threshold voltage distribution in response to a read request; and
outputting a signal indicating a failure of the read operation, without performing a soft decoding operation corresponding to the read operation, based on an abnormality of the threshold voltage distribution,
wherein the read operation comprises:
performing a default read operation with default read voltages on the memory cells;
in response to a failure of the default read operation, searching new read voltages by evaluating a shift of the threshold voltage distribution of the memory cells using a predetermined algorithm, the predetermined algorithm comprising performing one or more read operations with one or more predetermined read voltages, which are different from the default read voltages, on the memory cells; and
determining the abnormality of the threshold voltage distribution based on the new read voltages.

5. The operating method according to claim 4, wherein the abnormality of the threshold voltage distribution is determined based on a width of an interval defined by the new read voltages.

6. A memory system, comprising:
a memory device including memory cells having a threshold voltage distribution; and
a controller configured to:
control the memory device to perform a default read operation with default read voltages on the memory cells in response to a read request from a host;
in response to a failure of the default read operation, search new read voltages by evaluating a shift of the threshold voltage distribution of the memory cells by controlling the memory device to perform one or more read operations with one or more predetermined read voltages, which are different from the default read voltages, on the memory cells;
determine an abnormality of the threshold voltage distribution based on the new read voltages; and
output a signal indicating a failure of an operation according to the read request, without performing a soft decoding operation corresponding to the read operation, based on the abnormality of the threshold voltage distribution.

7. The memory system according to claim 6, wherein the abnormality of the threshold voltage distribution is determined based on a width of an interval defined by the new read voltages.

8. A memory system, comprising:
a memory device including memory cells having a threshold voltage distribution; and
a controller configured to:
control the memory device to perform a default read operation with a default read voltage on the memory cells in response to a read request from a host;
in response to a failure of the default read operation, search a new read voltage by evaluating a shift of the threshold voltage distribution of the memory cells by controlling the memory device to perform one or more read operations with one or more predetermined read voltages, which are different from the default read voltage, on the memory cells; and
determine an abnormality of the threshold voltage distribution based on the default read voltage and the new read voltage; and
output a signal indicating a failure of an operation according to the read request, without performing a soft decoding operation corresponding to the read operation, based on the abnormality of the threshold voltage distribution.

9. The memory system according to claim 8, wherein the abnormality of the threshold voltage distribution is determined based on whether the new read voltage falls within a voltage range defined by the default read voltage and a predetermined voltage value.

10. An operating method of a memory system, comprising:
performing a read operation on memory cells having a threshold voltage distribution in response to a read request; and
outputting a response signal based on a result of the read operation,
wherein the read operation comprises:
performing a default read operation with a default read voltage on the memory cells;
in response to a failure of the default read operation, searching a new read voltage by evaluating a shift of the threshold voltage distribution of the memory cells;
determining an abnormality of the threshold voltage distribution based on a difference between the default read voltage and the new read voltage; and
determining whether to use read data by the new read voltage in an error correction decoding operation based on the determination of the abnormality.

11. The operating method according to claim 10, wherein the searching the new read voltage is performed using a predetermined algorithm, the predetermined algorithm comprising performing one or more read operations with one or more predetermined read voltages, which are different from the default read voltage, on the memory cells.

12. The operating method according to claim 10, wherein the abnormality of the threshold voltage distribution is determined based on whether the new read voltage falls within a voltage range defined by the default read voltage and a predetermined voltage value.

13. The operating method according to claim 10, wherein the predetermined algorithm further comprises counting a number of memory cells included in a threshold voltage interval defined by the one or more read operations.

14. A memory system, comprising:
a memory device including memory cells having a threshold voltage distribution; and
a controller configured to:
control the memory device to perform a default read operation with default read voltages on the memory cells in response to a read request from a host;
in response to a failure of the default read operation, search new read voltages by evaluating a shift of the threshold voltage distribution of the memory cells by controlling the memory device to perform one or more read operations with one or more predetermined read voltages, which are different from the default read voltages, on the memory cells;
determine an abnormality of the threshold voltage distribution based on a difference between the default read voltage and the new read voltage; and
determine whether to use a read result by the new read voltage in an error correction decoding operation based on the determination of the abnormality.

15. The memory system according to claim 14, wherein the abnormality of the threshold voltage distribution is determined based on whether the new read voltage falls within a voltage range defined by the default read voltage and a predetermined voltage value.

16. The memory system according to claim 14, wherein the predetermined algorithm further comprises counting a number of memory cells included in a threshold voltage interval defined by the one or more read operations.

* * * * *